US010103738B2

United States Patent
Ek et al.

(10) Patent No.: US 10,103,738 B2
(45) Date of Patent: Oct. 16, 2018

(54) QUADRATURE PHASE DETECTOR CIRCUIT, QUADRATURE PHASE CORRECTOR, MULTI-ANTENNA RADIO CIRCUIT, RADIO STATION AND METHOD

(71) Applicant: Telefonaktiebolaget LM Ericsson (publ), Stockholm (SE)

(72) Inventors: Staffan Ek, Lund (SE); Sven Mattisson, Bjärred (SE); Tony Påhlsson, Lund (SE); Henrik Sjöland, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/579,966

(22) PCT Filed: Jun. 16, 2015

(86) PCT No.: PCT/EP2015/063498
§ 371 (c)(1),
(2) Date: Dec. 6, 2017

(87) PCT Pub. No.: WO2016/202368
PCT Pub. Date: Dec. 22, 2016

(65) Prior Publication Data
US 2018/0226977 A1    Aug. 9, 2018

(51) Int. Cl.
*H03L 7/085* (2006.01)
*H04B 7/08* (2006.01)
*H04B 1/04* (2006.01)

(52) U.S. Cl.
CPC .............. *H03L 7/085* (2013.01); *H04B 1/04* (2013.01); *H04B 7/08* (2013.01); *H04B 2001/0491* (2013.01)

(58) Field of Classification Search
CPC .. H03L 7/085; H04B 1/04; H04B 7/08; H04B 2001/0491
(Continued)

(56) References Cited

U.S. PATENT DOCUMENTS

2012/0025881 A1    2/2012    Ding et al.
2014/0132321 A1    5/2014    Kesselring et al.

OTHER PUBLICATIONS

Floyd, B., "Sub-Integer Frequency Synthesis Using Phase-Rotating Frequency Dividers", IEEE Transactions on Circuits and Systems—I: Regular Papers, Aug. 2008, pp. 1823-1832, vol. 55, No. 7.
(Continued)

*Primary Examiner* — Michael Neff
(74) *Attorney, Agent, or Firm* — Coats & Bennett, PLLC

(57) ABSTRACT

A quadrature phase detector circuit for a multi-antenna radio circuit comprising a plurality of frequency synthesizers using a common reference oscillator signal is disclosed. The quadrature phase detector comprises a first circuit arranged to collect a first state value indicating an inner state of a first quadrature signals generating frequency divider circuit of a first frequency synthesizer of the plurality of frequency synthesizers and a second state value indicating an inner state of a second quadrature signals generating frequency divider circuit of a second frequency synthesizer of the plurality of frequency synthesizers, a second circuit arranged to determine from the first state value and the second state value whether quadrature signals of the first frequency synthesizer and quadrature signals of the second frequency synthesizer are in-phase or out-of-phase, and a third circuit arranged to provide an output signal indicating whether the quadrature signals of the first frequency synthesizer and the quadrature signals of the second frequency synthesizer are in-phase or out-of-phase.

19 Claims, 11 Drawing Sheets

(58) Field of Classification Search
USPC .......................................................... 375/316
See application file for complete search history.

(56) References Cited

OTHER PUBLICATIONS

Axholt, A. et al., "A 60-GHz Receiver Front-End with PLL based Phase Controlled LO Generation for Phased-Arrays", Proceedings of the Asia-Pacific Microwave Conference, 2011, pp. 1534-1537.

Axholt, A. et al., "A PLL based 12 GHz LO generator with digital phase control in 90 nm CMOS", Asia Pacific Microwave Conference, Dec. 7-10, 2009, pp. 309-318.

Shu, K. et al., "A 2.4-GHz Monolithic Fractional-N Frequency Synthesizer With Robust Phase-Switching Prescaler and Loop Capacitance Multiplier", IEEE Journal of Solid-State Circuits, Jun. 2003, pp. 866-874, vol. 38, No. 6.

QUADRATURE PHASE DETECTOR CIRCUIT, QUADRATURE PHASE CORRECTOR, MULTI-ANTENNA RADIO CIRCUIT, RADIO STATION AND METHOD

TECHNICAL FIELD

The present invention generally relates to a quadrature phase detector circuit for a multi-antenna radio circuit comprising a plurality of frequency synthesizers using a common reference oscillator signal, and a quadrature phase corrector, a multi-antenna radio circuit and a radio station having such a quadrature phase detector circuit, and a method of a multi-antenna radio arrangement.

BACKGROUND

As radio circuits become more complex and also are designed to work at still higher frequencies, the elements tend to consume more power. Frequency dividers are important elements of radio circuits, and are for example used for synthesizing signals of desired frequency and phase. For example, multi-band radio circuits rely on the ability to generate signals at different controllable frequencies. Another example is application of beamforming where a plurality of antennas is fed by signals with a controlled phase such that the arrangement of the plurality of antennas provides a desired directional characteristic.

It is foreseen that cellular systems may use millimeter waves. The frequencies may in such cases range from about 15 to 60 GHz. In order to use the system outdoors, a longer cyclic prefix may be used compared with 60 GHz indoor systems. For this, a closer sub-carrier spacing in the OFDM modulation may be advantageous, however posing stringent phase noise requirements. At the same time beamforming is advantageously supported to increase the range and capacity of the system. A large number of antenna elements are then used. The signal at each element will have an individual phase shift which controls the beam direction. One key implementation alternative is to impose phase shifts in the local oscillator signal. The local oscillator frequency is in such cases preferably made programmable to be able to operate on different channels and in different bands. Individual local oscillators can then be placed in close vicinity to the antenna element making local oscillator phase noise between antennas uncorrelated. One alternative for the generation of quadrature phase local oscillator signals used for single side band up-/down-conversion is to use frequency dividers.

An implementation of the local oscillator generation circuitry beneficially strives towards achieving low phase noise, individually programmable phase, programmable frequency, and/or distributing the signals to all transceivers in a beamforming system, all without consuming excessive power.

Quadrature frequency dividers, able to generate signals with 90 degrees phase shift may have two different modes of operation. The two modes have their output phases shifted 180 degrees with respect to each other. The actual mode of operation depends on the initial state of the divider whereof each of the two possibilities ideally has 50% probability. In a multi-antenna system, combining antenna streams down/up converted with quadrature local oscillator signals 180 degrees shifted will not result in constructive combining of the signals as intended. In a receiver where each signal path is converted to digital domain and then combined, this could be compensated for in the digital base-band, but if combining is to be done in analog domain, this needs to be corrected for before combining. In a transmitter this also needs the same attention in analog domain.

Direct detection of the actual phase relationship of the LO-signals could be done, but would require great care, especially at mm wave frequencies, to really make sure that the signal comparison is made correctly without losing the information when distributing the signals to the point of comparison. If direct sampling of a signal above 10 GHz is to be done, there is a 50 ps window to perform the sampling, which would require great care when routing the sampling signal over an antenna array, possibly covering several square centimeters.

The initial state of the frequency dividers could be controlled, although not trivially, but would require the individual synthesizers to settle in identical ways. Thus, this is hard considering mismatch between them.

It is therefore a desire to provide an approach for an electronic circuit to alleviate this.

SUMMARY

According to a first aspect, there is provided a quadrature phase detector circuit for a multi-antenna radio circuit. The multi-antenna radio circuit comprises a plurality of frequency synthesizers using a common reference oscillator signal. The quadrature phase detector comprises a first circuit arranged to collect a first state value indicating an inner state of a first quadrature signals generating frequency divider circuit of a first frequency synthesizer of the plurality of frequency synthesizers and a second state value indicating an inner state of a second quadrature signals generating frequency divider circuit of a second frequency synthesizer of the plurality of frequency synthesizers. The quadrature phase detector further comprises a second circuit arranged to determine from the first state value and the second state value whether quadrature signals of the first frequency synthesizer and quadrature signals of the second frequency synthesizer are in-phase or out-of-phase. The quadrature phase detector further comprises a third circuit arranged to provide an output signal indicating whether the quadrature signals of the first frequency synthesizer and the quadrature signals of the second frequency synthesizer are in-phase or out-of-phase.

The first circuit may comprise connections to control signals of the first frequency divider circuit and control signals of the second frequency divider circuit. The second circuit may be arranged to observe a least significant bit of the respective control signals and to determine the first frequency synthesizer and the second frequency synthesizer to be in-phase when the least significant bits are equal and to determine the quadrature signals of the first frequency synthesizer and the quadrature signals of the second frequency synthesizer to be out-of-phase when there is a difference between the least significant bits. The second circuit may comprise an exclusive-or circuit receiving the least significant bits of the respective control signals, and the third circuit comprises the output of the exclusive-or circuit.

According to a second aspect, there is provided a quadrature phase corrector for a multi-antenna radio circuit. The multi-antenna radio circuit comprises a plurality of frequency synthesizers using a common reference oscillator signal. The quadrature phase corrector comprises a quadrature phase detector according to the first aspect and a correction signal circuit arranged to, based on the output of the quadrature phase detector, provide a correction signal to the second frequency synthesizer causing the second frequency synthesizer to change phase.

The correction signal may be arranged to temporarily adapt any one of a divide factor used for the second frequency divider and a control signal of the second frequency divider.

According to a third aspect, there is provided a multi-antenna radio circuit comprising a plurality of frequency synthesizers for respective antenna, wherein at least two of the plurality of frequency synthesizers are using a common reference oscillator signal, and each comprises a feedback frequency divider circuit arranged to receive an oscillating signal and output an output signal at a frequency having a frequency relation with the oscillating signal defined by a divide ratio. The frequency divider circuit comprises a first frequency divider arranged to receive the oscillating signal and output N signals of different phases and each with a frequency of 1/M of the oscillating signal, a second frequency divider arranged to receive one of the N signals and frequency divide the received signal by a value given by a first control signal provided to the second frequency divider, N latch circuits each being arranged to receive a respective one of the N signals at a clocking input of the respective latch circuit and to receive an output of the second frequency divider at an input of the respective latch circuit, a multiplexer circuit arranged to receive outputs of the N latch circuits and to output a signal, on which the output signal is based, selected from the received signals based on a second control signal provided to the multiplexer circuit, and a control circuit arranged to provide the first control signal and the second control signal based on the divide ratio. The multi-antenna radio circuit further comprises a quadrature phase corrector according to the second aspect.

The state values may comprise the second control signals.

The inner state value of a first frequency synthesizer of the plurality of frequency synthesizers may be compared with each of the other frequency synthesizers of the plurality of frequency synthesizers for determining whether the quadrature signals of them are in-phase or out-of-phase, respectively, with relation to the quadrature signals of the first frequency synthesizer. The frequency synthesizer of the plurality of frequency synthesizers to be the first frequency synthesizer may be determined dynamically. Alternatively, the frequency synthesizer of the plurality of frequency synthesizers to be the first frequency synthesizer may be fixed.

The control circuit may be a state machine arranged to provide the first and the second control signals for each cycle of the output signal of the electronic circuit based on the divide ratio and a selected phase by the multiplexer circuit for a preceding cycle of the output signal. The control circuit may comprise an integer divider circuit arranged to divide the divide ratio by M and provide an integer quotient value and an integer remainder value, a modulo-M-counter arranged to receive the remainder value as an input and the output signal as a clocking input, and to output a count value and a carry value, and an adder circuit arranged to add the quotient value and the carry value to form the first control signal, wherein the second control signal is based on the count value. The control circuit may comprise a latch circuit arranged to receive the count value as an input and the output signal of the electronic circuit as a clocking signal, wherein the output from the latch circuit is the second control signal.

According to a fourth aspect, there is provided a radio station comprising a multi-antenna radio circuit according to the third aspect and an antenna arrangement comprising a plurality of antenna elements each associated with a respective one of the plurality of frequency synthesizers.

According to a fifth aspect, there is provided a method of a multi-antenna radio arrangement. The multi-antenna radio arrangement has a plurality of antenna elements each associated with a respective one of a plurality of frequency synthesizers, where at least two of the frequency synthesizers each comprises a feedback quadrature signals generating frequency divider circuit arranged to receive an oscillating signal and output quadrature signals at a frequency having a frequency relation with the oscillating signal defined by a divide ratio, and the feedback quadrature signals generating frequency dividers are each controlled by a state machine arranged to provide control signals for each cycle of the output signal of the feedback quadrature signals generating frequency divider based on the divide ratio and a selected phase for a preceding cycle of the output signal. The method comprises collecting a first state value indicating an inner state of a first quadrature signals generating frequency divider circuit of a first frequency synthesizer of the plurality of frequency synthesizers and a second state value indicating an inner state of a second quadrature signals generating frequency divider circuit of a second frequency synthesizer of the plurality of frequency synthesizers, determining from the first state value and the second state value whether the quadrature signals of the first frequency synthesizer and the quadrature signals of the second frequency synthesizer are in-phase or out-of-phase, and providing a phase state signal indicating whether the quadrature signals of the first frequency synthesizer and the quadrature signals of the second frequency synthesizer are in-phase or out-of-phase.

The quadrature signals generating frequency divider circuit may comprise a first frequency divider arranged to receive the oscillating signal and output N signals of different phases and each with a frequency of 1/M of the oscillating signal, a second frequency divider arranged to receive one of the N signals and frequency divide the received signal by a value given by a first control signal provided to the second frequency divider, N latch circuits each being arranged to receive a respective one of the N signals at a clocking input of the respective latch circuit and to receive an output of the second frequency divider at an input of the respective latch circuit; and a multiplexer circuit arranged to receive outputs of the N latch circuits and to output a signal, on which the output signal is based, selected from the received signals based on a second control signal provided to the multiplexer circuit, wherein the respective state machine comprises a control circuit arranged to provide the first control signal and the second control signal based on the divide ratio. The states may comprise the control signals of the first frequency divider circuit and the control signals of the second frequency divider circuit, and the determining may comprise observing a least significant bit of the respective control signals and determine the first frequency synthesizer and the second frequency synthesizer to be in-phase when the least significant bits are equal and determine the first frequency synthesizer and the second frequency synthesizer to be out-of-phase when there is a difference between the least significant bits.

The method may comprise providing, based on the determining, a correction signal to the second frequency synthesizer, and changing phase of the second frequency synthesizer based on the correction signal. The changing of phase may comprise temporarily adapting any one of a divide factor used for the second frequency divider, and a control signal of the second frequency divider.

Other objectives, features and advantages of the present invention will appear from the following detailed disclosure, from the attached dependent claims as well as from the drawings. Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

DETAILED DESCRIPTION

Figure 1:
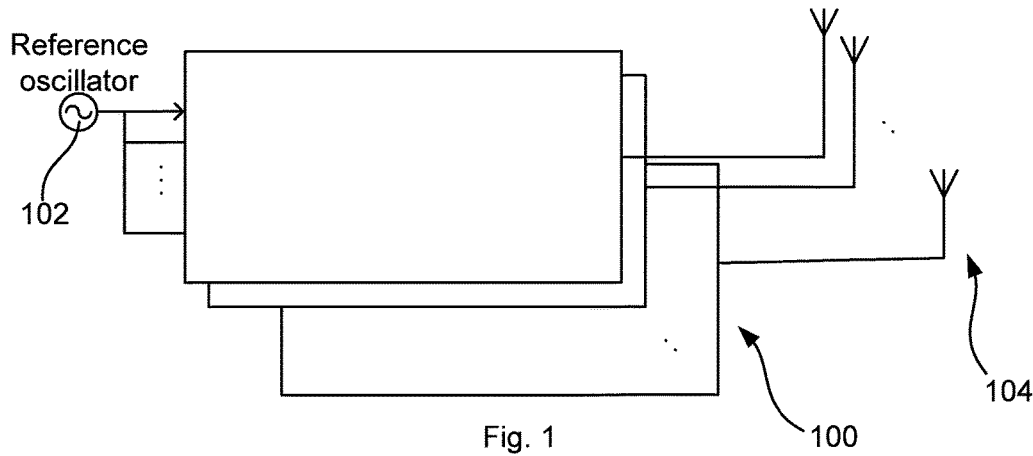
FIG. 1 illustrates a receiver, transmitter or transceiver which is provided a reference signal at an accurately defined frequency from a reference oscillator to be able to transmit/receive signals at a desired frequency by an antenna.

FIG. 1 very schematically illustrates receivers, transmitters or transceivers 100 which are provided with a reference signal at an accurately defined frequency from a reference oscillator 102 to be able to transmit/receive signals at a desired frequency by respective antennas 104. The reference oscillator 102 normally provides a fixed frequency. To enable sending/transmitting at the desired frequency, a frequency is synthesized based on the reference signal. For this, a phase-locked loop (PLL) may be used. For the more complex tasks of the receivers/transmitters/transceivers such as beamforming, e.g. as discussed in the background section, it is not only the frequency of a signal that is desired; it is also its correct phase.

Figure 2:
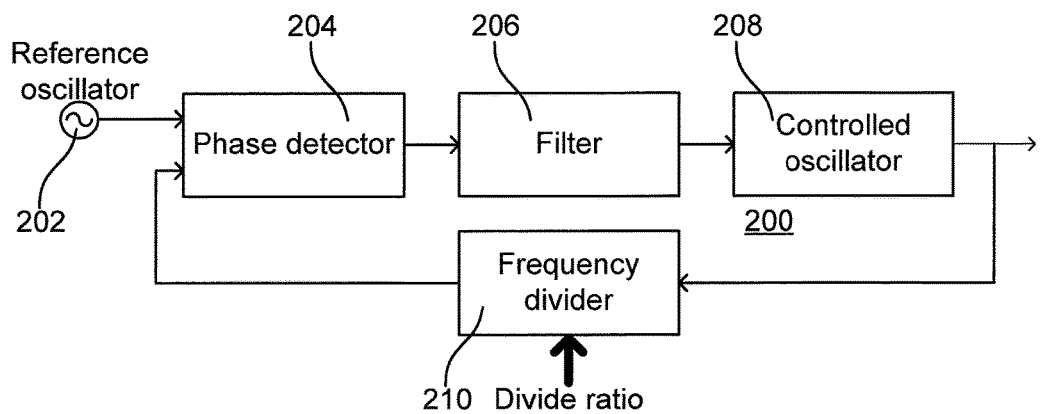
FIG. 2 schematically illustrates a phase-locked loop.
Figure 3:
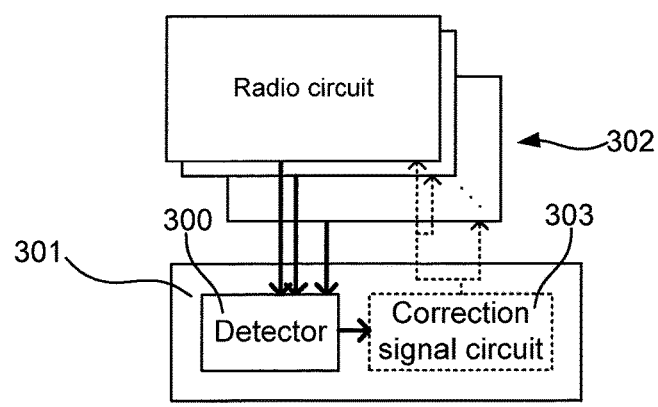
FIG. 3 is a block diagram which illustrates a plurality of radio units and a quadrature phase detector according to an embodiment.
Figure 4:
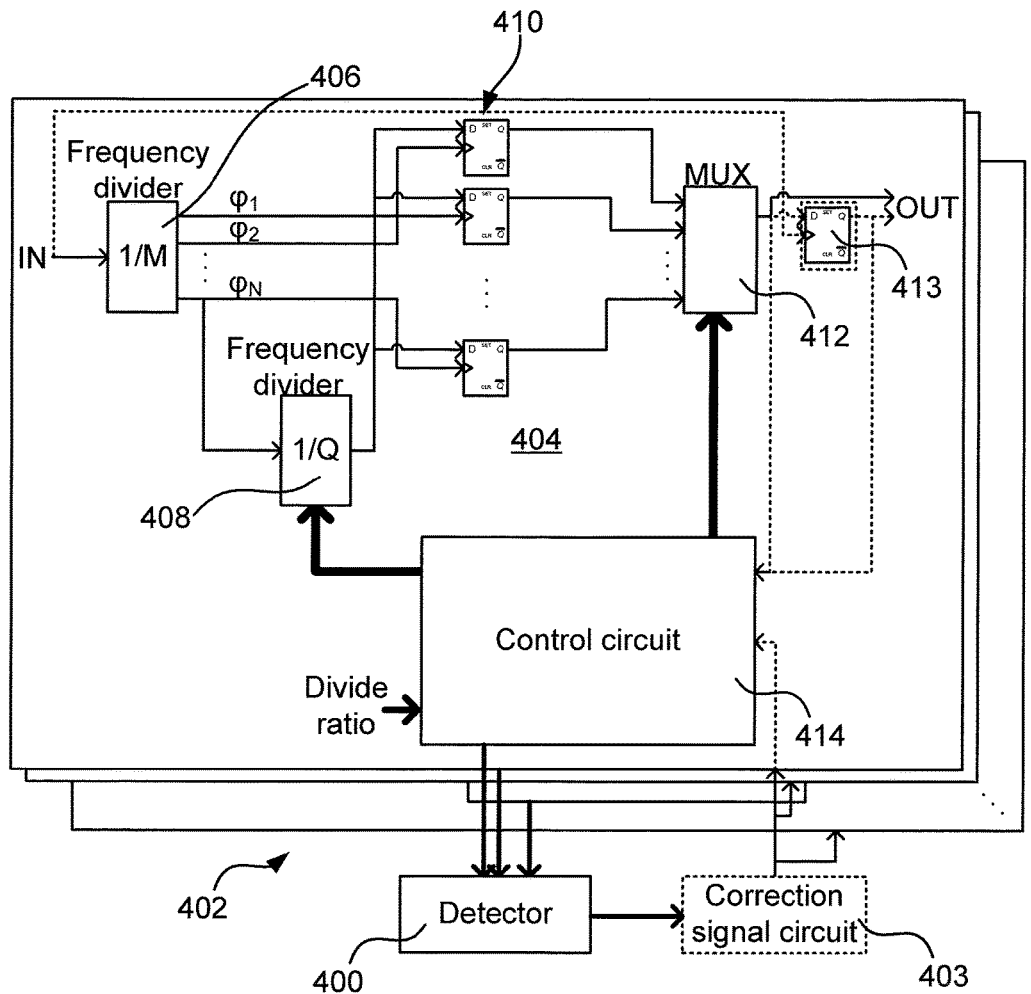
FIG. 4 schematically illustrates a quadrature phase detector monitoring a plurality of radio units of a multi-antenna radio circuit according to an embodiment.

FIG. 2 schematically illustrates a PLL 200. The PLL receives the reference signal from a reference oscillator 202. The PLL 200 comprises a phase detector 204, a filter 206, a controlled oscillator 208 and a frequency divider. The phase detector 204 compares phases of the reference signal and a frequency divided replica of the output of the controlled oscillator 208. The phase detector 204 thus outputs a signal indicative of phase difference therebetween. The output signal of the phase detector 204 is filtered by the filter 206 to provide a proper control signal for the controlled oscillator 206, which in turn outputs an oscillating signal based on that control signal. The controlled oscillator 208 may be a voltage controlled oscillator, wherein the control signal is defined by a voltage. Other types of controlled oscillators may also be used, e.g. digitally controlled oscillators, wherein the control signal is a digital value. The oscillating signal output by the controlled oscillator 208 is the output of the PLL 200, and by feeding back the output signal via the frequency divider 210, the PLL will strive towards a locked state where the fed back and frequency divided signal becomes equal to the reference signal, which implies that the relation between the output signal of the PLL 200 and the reference signal will be defined by the frequency divider 210. That is, the fed back frequency divided signal and the reference signal become equal, on average, in phase and frequency by the phase detector 204 providing the signal indicating the phase difference, which signal then affects, via the structure demonstrated above, the controlled oscillator 208. Thus, the expression "equal" is here not to be construed that the above mentioned signals at all times are precisely the same, but is to be construed that the fed back frequency divided signal is regulated, with the constraints of a practical implementation, to be as close as possible, in phase and frequency, to the reference signal. By controlling the frequency divider 210 by a divide ratio, desired properties of the output of the PLL 200 can be achieved. Roughly said, by enabling any value of the divide ratio, any properties of the output signal of the PLL 200 can be achieved. The embodiments of frequency dividers demonstrated below with reference to FIGS. 3 and 4 provides for enabling a variety of divide ratios that traditionally has been hard to achieve.

For operating a radio circuit of the type indicated above, generation of local oscillator signals with phase control is desired. The topic has been discussed in e.g., "A PLL based 12 GHz LO generator with digital phase control in 90 nm CMOS", by A. Axholt and H. Sjöland in Analog Integrated Circuits and Signal Processing, Vol. 67, No. 3, pp. 309-318, 2011 and "A 60 GHz receiver front-end with PLL based phase controlled LO generation for phased-arrays", by A. Axholt and H. Sjöland in Analog Integrated Circuits and Signal Processing, Vol. 80, No. 1, pp. 23-32, 2014. For beamforming, each antenna element is connected to a transceiver, and each transceiver receives local oscillator (LO) signals from a phase-controlled phase locked loop (PLL). All PLLs receive a common lower frequency reference signal, e.g. in the low gigahertz range. In this way it is enough to distribute the reference signal across a radio chip, which can be done at much lower power than distributing the LO signal directly. The PLLs will then locally multiply the reference to a higher frequency and generate quadrature LO signals. By using a common reference signal, the output signals of the PLLs will be fixed in frequency and phase. Digitally controlled current sources may be used to inject current into the loop filter of the PLL, which will produce a very accurately controlled and linear phase shift of the output signal. However, as discussed in the introductory section, frequency dividers operating as quadrature dividers may operate in different modes depending on an initial state of the frequency divider. If the quadrature divider is forming the first stage of the synthesizer feedback divider, which is preferred in a system with distributed LO signal generation because of reduced power consumption, the phase relationship can be detected indirectly through the states of the feedback dividers, when settled. Specifically using phase rotators, as will be discussed below, selecting signals from fixed dividers for improved divider resolution, the actual signals selected, compared with corresponding signals from other synthesizers can give information about the current states of the quadrature dividers. According to embodiments, it is suggested to compare the states of the different feedback divider phase rotators in a multi-antenna system as demonstrated with reference to FIG. 1 at certain time instances. The result of the comparison is either in-phase or out-of-phase. Based on the result, it is feasible to correct for possible phase imbalances e.g. by performing a phase jump of each synthesizer that is out of phase. A rapid phase jump may for example be performed through direct modulation of the synthesizer oscillator. FIG. 3 is a block diagram which illustrates a plurality of radio units 302, e.g. receivers, transmitters or transceivers of a multi-antenna radio circuit, each comprising a PLL with a programmable frequency divider operating as a quadrature divider. Corresponding signals from the radio units 302, indicating a state as will be provided by examples below, are provided to a quadrature phase detector 300 which provides a result signal indicating whether any of the radio units, and preferably which, is in-phase or out-of-phase. The result may be provided to a correction signal circuit 303 which provides a signal for affecting the respective radio circuit 302 to come in-phase. The functions of the quadrature phase detector 300 and the correction signal circuit 303 may be implemented in a quadrature phase control circuit 301.

The states may be updated once every reference cycle. Considering a multi-antenna radio circuit operating on a very high frequency, say above 10 GHz, phase comparison on all >10 GHz quadrature LO-signals of the antenna arrays would require a sampling window less than 50 ps if the monitoring whether the phases are correct is to be done directly on the LO signals of the radio units. The here suggested approach relaxes those requirements significantly. Instead of making the phase comparison on all >10 GHz quadrature LO signals of the antenna array, a sampling window of more than 2 ns is feasible, considering a reference frequency of less than 500 MHz, where the digital states of each synthesizer phase rotator can be sampled. This significantly relaxes the demands compared with the detection where the sampling window would be below 50 ps.

The way of detecting the state of the dividers according to some embodiments requires no additional analog hardware. The states may there be read out from the digital state-machine controlling the phase-rotation. According to some embodiments the way of correcting for the phase imbalance requires no additional hardware. If the correction is to be done rapidly, e.g. faster than the PLL time-constant, additional circuitry to modulate the synthesizer oscillator is needed. For some embodiments, the modulation circuitry may be used for this purpose as well. For some embodiments, the adjustment is done once at start-up of the system and the additional settling when performing the correction would not significantly affect the total throughput.

Figure 6:
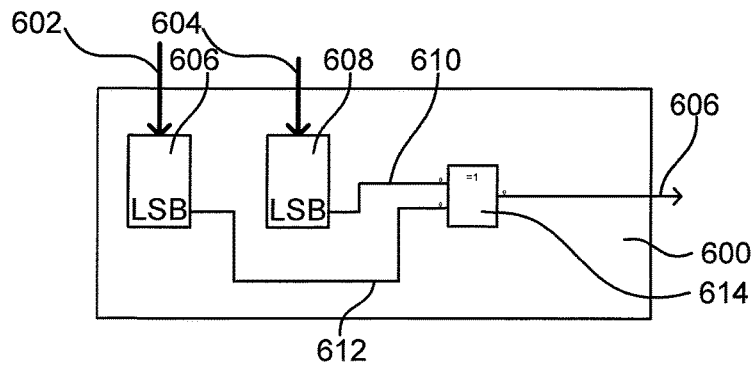
FIG. 6 is a block diagram schematically illustrating a quadrature phase detector according to an embodiment.

Below is a discussion about frequency dividers provided for the easier understanding of the examples given with reference to FIGS. 4-6. To make the frequency programmable with high resolution, and still be able to use a high crystal reference frequency which is desired for low noise, so called fractional-N frequency synthesis is applied. In a fractional-N frequency synthesizer the effective frequency division in the feedback path is a non-integer number. This is accomplished by having a varying modulus of the divider, i.e. it alternates dividing by different numbers. This is performed in such a way that the average division number equals the target value. Analyzing the frequency contents of the series of division numbers, the average will produce a direct current (DC) value that is correct, accompanied by quantization noise. Depending on how the variation is done the quantization noise will take different spectral shapes. In a classical circuit the divider is modulated periodically, creating strong tones called fractional spurs. In present circuits it is popular to use delta-sigma modulators instead, that instead of spurs produce a high-pass shaped noise. Having a high-pass shaped noise is beneficial, since the PLL has a low-pass characteristic that then suppresses it. However, some design constraints on loop bandwidth and filter characteristic must be met for the quantization noise to be suppressed to a level below other noise sources. For each antenna element transceiver, a very fast frequency divider with programmable modulus is then needed.

By using a fixed division number divider for the highest frequencies, which for example may divide by two or four by a prescaler, implies that a circuitry of less complexity. Dividing by two or four is also beneficial, as it can produce a quadrature signal needed by the transceiver. It is beneficial to keep this first frequency division circuitry as simple as possible by using a fixed division number. However, a problem implied by this is frequency resolution. If the succeeding dividers can only divide by integer numbers, the resolution becomes M input clock cycles, where M is division number of the prescaler, which is equal to two or four in the example above. Through the use of quadrature dividers and switching between the output phases, where the phase difference between subsequent phases equals a voltage controlled oscillator (VCO) cycle, the full resolution may be restored, as for example is discussed in "Sub-Integer Frequency Synthesis Using Phase-Rotating Frequency Dividers" by Brian A. Floyd in IEEE TRANSACTIONS ON CIRCUITS AND SYSTEMS I: REGULAR PAPERS, VOL. 55, NO. 7, AUGUST 2008.

One way for phase rotating multi-modulus dividers is to shift between the phases directly at the multi-phase divider output. Using only four phases, the relative phase shift is as large as 90 degrees, which means little overlap between pulses from different phases. This makes the switching at multi-GHz troublesome. If the switching is not done in the correct moment, i.e. when pulses from consecutive phases are overlapping each other, the output is prone to contain glitches, possibly resulting in miscounts in following divider stages. One way to relieve the phase rotating operation is to divide further and create even more phases, as for example is discussed in "A 2.4-GHz Monolithic Fractional-N Frequency Synthesizer With Robust Phase-Switching Prescaler and Loop Capacitance Multiplier" by Keliu Shu, et al. in IEEE JOURNAL OF SOLID-STATE CIRCUITS, VOL. 38, NO. 6, JUNE 2003. The phase difference becomes smaller, e.g. in Keliu et al. 45 degrees, and the phase shifting between consecutive phases is less sensitive to time accuracy. Disadvantages of the solution are that the divider tree grows, causing excessive power consumption, and that the parallel dividers may start up in two different states, with different phase order. The actual state thus needs to be detected and corrected for.

Even if the phase difference is made smaller it is not likely that it is possible to switch between other than nearby phases. Of natural reasons, it would be difficult to switch between phase 0 and phase 4 in a phase rotator with 8 equally spaced phases covering a full period. A common way of achieving consecutive divide ratios using (N+1)/N prescalers is to apply a so called swallow counter. The phase rotator divider is followed by two counters where an S counter, i.e. the swallow counter, counts the number with rotation and a P counter counts the full number of cycles with- and without rotation. Using a phase rotator with 8 phases, the output is either divide by 8 or divide by 9. A problem with this approach is that there is a minimum total divide ratio achievable for full divide ratio coverage. This may sound mysterious but is clarified by the following example: First, counting 3 output pulses with rotation and then 2 without, the total output is 8·3+9·2=42. Altering to 8·2+9·3=43 yields the consecutive divide ratio and so on up to 8·0+9·5=45. With P=6, the minimum divide ratio is 8·6+9·0=48 I.e. with an 8/9 divider, 46-47 are not valid divide ratios. This imposes a requirement on highest possible reference frequency. Consider for example a reference frequency of ~500 MHz, which would be troublesome with a VCO frequency of 20 GHz as 7 or more consecutive divide ratios are common for use in a Delta-Sigma fractional-N PLL.

FIG. 4 schematically illustrates a quadrature phase detector 400 monitoring a plurality of radio units 402, e.g. of a multi-antenna radio circuit. Each radio unit 402 is assumed to have an arrangement as demonstrated above including a frequency divider circuit 404 acting as phase rotator which uses another way of multiplexing the signals. A first configurable frequency divider 406 operating at 1/M, e.g. ¼, of the input frequency takes care of the coarse division and the re-clocking done by N phases $\varphi_1, \varphi_2, \ldots, \varphi_N$ gives the fine resolution. For example, N may be four, as is used in the example demonstrated below, but may for example be $2^P$, where P is an integer, or N may be any other integer suitable for the implementation.

In the following example, M is chosen to be 4 and N is chosen to be 4. This provides for readily available quadrature signals. For the sake of easier understanding, only one of the quadrature signals, e.g. the in-phase signal, is illustrated, but the skilled reader readily understands how to provide the full quadrature signal. According to one example, the frequency division by the first frequency divider 406 may be performed in two steps where a first divide-by-two divider provides the quadrature signals and one of them, e.g. the in-phase signal is divided by a second divide-by-two divider which provides four signals with phase values $\varphi_1, \varphi_2, \ldots \varphi_N$. Since the feedback divider 406 is in the PLL, as demonstrated above, both the in-phase part and the quadrature part of the quadrature signal will get the desired frequency and phase therewith. Thus, the benefit of this approach is that the phase differences between the output pulses after the initial divide-by-4 (0°, 90°, 180°, 270°) are divided by a division-value Q in a second frequency divider 304. I.e. the relative phase difference between the phases going into the multiplexer decreases to 0°, (90/Q)°, (180/Q)°, (270/Q)°. Hence, with e.g. Q>4 it is possible to do phase shifts between non-consecutive phases. This enables the use of only one configurable divider and a multiplexer 412.

The N formed versions of the frequency divided signal with different phases $\varphi_1, \varphi_2, \ldots \varphi_N$ are used for clocking latch circuits 410, respectively. This enables providing an input signal to the latch circuits 410 with a corresponding phase shift. As input to the latch circuits 410 an output from a second frequency divider 408 is used. The second frequency divider 408 is configurable and provides a frequency division by Q, where Q is determined by a first control signal. The outputs of the latch circuits 410 are provided to the multiplexer 412, where the output of the frequency divider circuit 404 is selected based on a second control signal.

The signal provided from the multiplexer 412 may then be re-clocked again with the input signal, e.g. by a latch circuit 413, which clocking will improve jitter performance of the frequency divider circuit output.

Digital control of the division number is applied at input of the second divider 408 and at control input of the multiplexer 412. The control may be provided by a control circuit 414. The control may involve using a state machine which is keeping track of the currently selected phase and dependent of which is the succeeding divide ratio, selecting the next Q-value, output phase and switching moment. Although the frequency is relatively low and the phases are overlapping, a glitch-free phase switching may be secured. An example of a scenario with a fixed divide ratio, 41, would require the pattern for (Q, MUX): (10,1), (10,2), (10,3), (11,0), (10,1), (10,2), (10,3), (11,0), . . . .

The detector 400 monitors the control circuit 414, and preferably certain internal signals of the control circuit 414 from which the phase state of the respective radio units 402 may be easily derived. Here, FIG. 5 will demonstrate an example of a frequency divider which in addition to a neat way of controlling the frequency divider also provides a very efficient, particularly in sense of its low complexity, of detecting whether the radio units are in-phase with each other, which will be demonstrated with reference to FIG. 6. As in FIG. 4, for the sake of easier understanding, only one of the quadrature signals, e.g. the in-phase signal, is illustrated, but the skilled reader readily understands how to provide the full quadrature signal.

Figure 5:
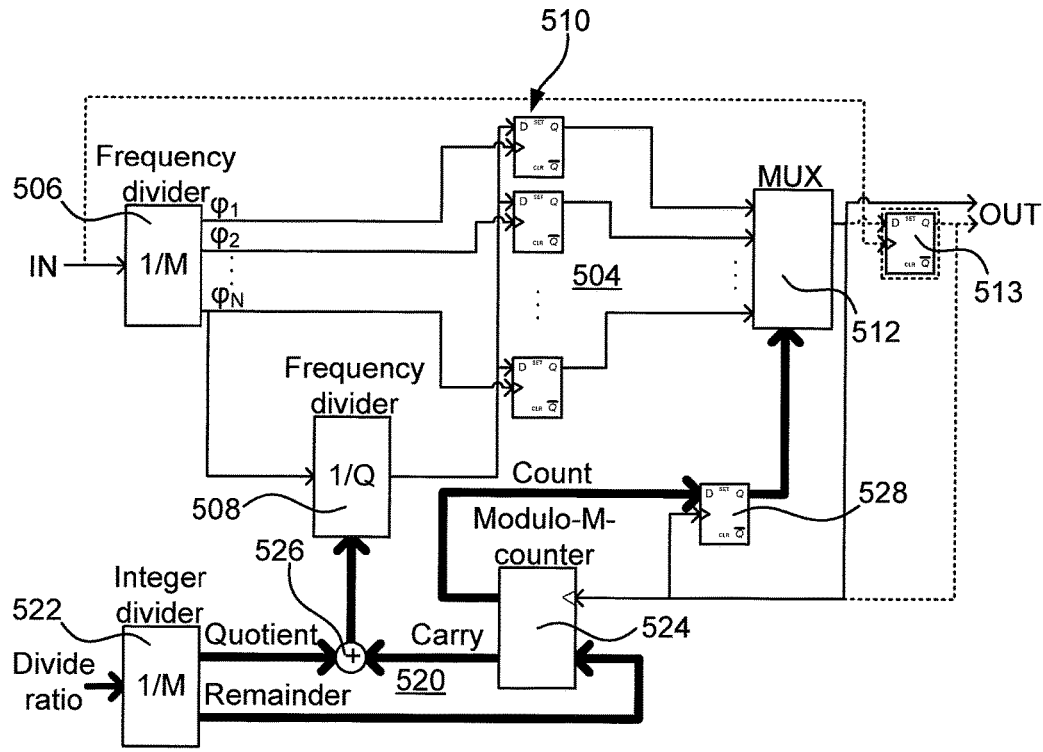
FIG. 5 schematically illustrates a frequency divider circuit according to an embodiment.

FIG. 5 schematically illustrates a frequency divider circuit 504 acting as phase rotator, which similar to the one demonstrated with reference to FIG. 4 comprises a first frequency divider 506, a second frequency divider 508, N latch circuits 510, and a multiplexer 512, and optionally also an output signal latch circuit 513. The control logic generating the control for the first frequency divider 506 and the multiplexer 512 may be implemented as schematically illustrated in FIG. 5. Depending on the second frequency divider implementation, additional circuitry to control the switching moment for the two control signals may be needed. Following the example above using a divide ratio above it is clear that the control logic could generate the sequence. A delay element 528 for the multiplexer control signal may be provided because the second frequency divider 508 normally needs its divide ratio before the start of a new output cycle. The delay element 528 may be a latch clocked by one of the phase shifted signals provided to the multiplexer 512. Preferably, the one of the phase shifted signals with largest phase shift is selected for the clocking for providing a glitch-free operation.

The divide ratio, e.g. 41 as of the example mentioned above, to be applied is provided to an integer divider 522 which provides a quotient value and a remainder value based on the division factor M applied by the frequency divider 506. The remainder value is provided to a modulo-M-counter 524 which is clocked by the output signal of the frequency divider circuit 504. The modulo-M-counter provides a count value and a carry value. The carry value is provided to an adder 526 which adds the carry value to the quotient value to provide a control signal for the second frequency divider, which thus is controlled to perform frequency division based on the control signal, i.e. divide frequency by the added value. The modulo-M-counter provides the count value to the delay element 528 which outputs count values, based on timing when all inputs to the multiplexer 512 are settled, as a control signal for the multiplexer 512 which selects the one of the phase-shifted signals to output accordingly. This state machine mechanism comprising the integer divider 522, the modulo-M-counter, the adder 526 and the delay element 528 thus makes the frequency divider circuit 504 provide frequency division according to the desired divide ratio as discussed above.

For a multi-antenna radio circuit scenario for beamforming, all of the radio units will operate at the same frequency, i.e. with the same divide ratio. Consider the multiplexer 512 to be arranged to select one out of four signals from the latch circuits 510. This may be controlled by e.g. a 2-bit control signal from the modulo-M-counter 528. By observing these control signals from two radio units, the quadrature phase state may be detected. FIG. 6 illustrates an example on a quadrature phase detector 600. The quadrature phase detector 600 receives control signals 602, 604 as mentioned above from two radio units. From each of the control signals 602, 604 a least significant bit (LSB) is extracted by respective signal extractors 606, 608 and logic signals are provided accordingly to an exclusive-OR (XOR) gate 614. The XOR gate 614 provides a logic signal 616 which will indicate whether the quadrature signals of the radio units are in-phase. That is, when the LSBs are equal, i.e. both 0 or both 1 causing a logic 0 as output signal 616, the quadrature signals of the radio units are in-phase. Otherwise, a logic 1 is output indicating a phase error. As the different control circuits may be asynchronous, either inputs or output may need to be sampled at time instances where the signals are stable, e.g. at an edge of the reference clock which is not used for phase comparison for the PLL.

Returning to FIG. 1, the receivers/transmitters/transceivers with respective PLLs, each including a frequency divider as demonstrated above, may be used in a radio station. The radio station may for example be a network node of a wireless communication network, e.g. network node such as a base station of a cellular network or an access point of a short-range communication network, etc., or in a terminal device of a wireless communication network, e.g. a phone, modem, communication card, etc., which may be arranged to operate in a cellular network and/or a short-range communication network, etc.

Figure 7:
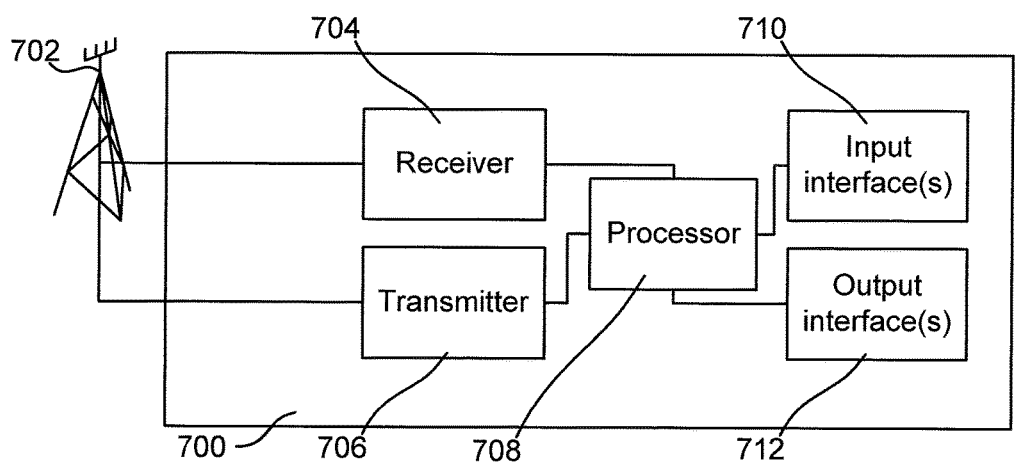
FIG. 7 schematically illustrates a network node according to an embodiment.

FIG. 7 schematically illustrates such a network node 700 according to an embodiment. The network node 700, which becomes a part of an access network of the system in which it operates, comprises an antenna arrangement 702 comprising a plurality of antennas and a plurality of receivers 704 and/or transmitters 706 implemented in one or more multi-antenna radio circuits. The network node 700 may also comprise a processor 708 arranged to control the receivers 704 and/or transmitters 706. The network node 700 may also comprise one or more input interfaces 710 and/or output interfaces 712. Here, the interfaces 710, 712 may comprise signalling interfaces, operator interfaces, etc.

Figure 8:
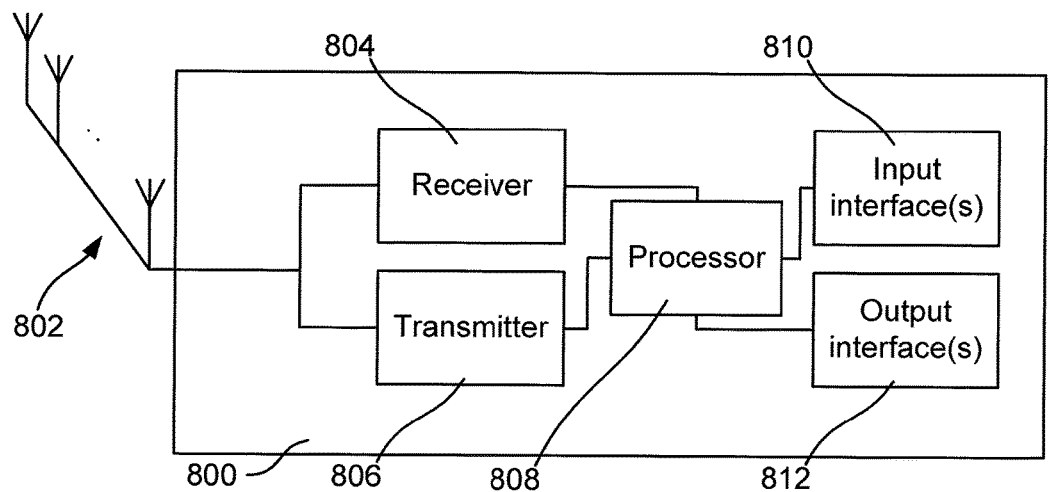
FIG. 8 schematically illustrates a terminal device according to an embodiment.

FIG. 8 schematically illustrates such a terminal 800 according to an embodiment. The terminal 800 comprises an antenna arrangement 802 comprising a plurality of antennas and a plurality of receivers 804 and/or transmitters 606 implemented in one or more multi-antenna radio circuits. The terminal 800 may also comprise a processor 808 arranged to control the receivers 804 and/or transmitters 806. The terminal 800 may also comprise one or more input interfaces 810 and/or output interfaces 812. Here, the interfaces 810, 812 may comprise signalling interfaces, user interfaces, etc.

Figure 9:
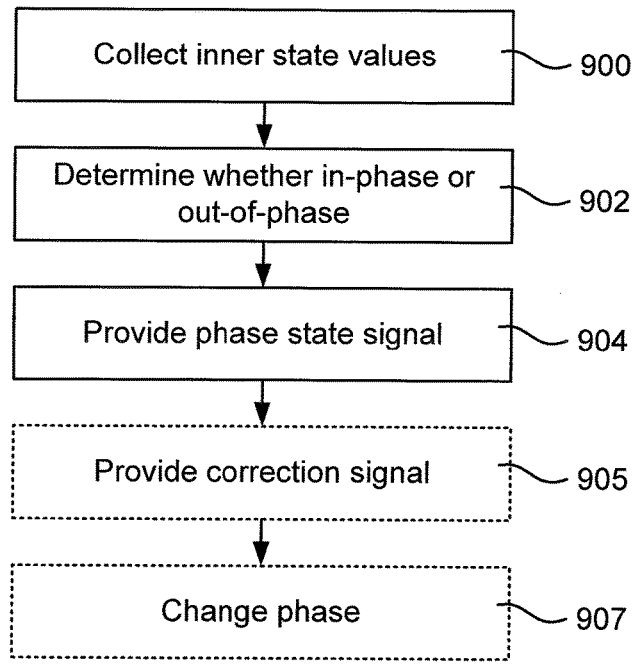
FIG. 9 is a flow chart illustrating a method according to an embodiment.

FIG. 9 is a flow chart illustrating a method of frequency dividing according to an embodiment. Inner state values, such as control signals as demonstrated above, are collected 900 from respective radio unit. A feedback frequency divider of a PLL of the respective radio unit is controlled by a state machine arranged to provide the control signals for each cycle of the output signal of the feedback quadrature signals generating frequency divider based on the divide ratio and a selected phase for a preceding cycle of the output signal. Based on the collected inner state values, it is determined 902 whether LO signals of the radio units are in-phase or out-of-phase. A phase state signal is provided 904 based on the determination 902. The determining 902 may comprise, for a frequency divider structure as discussed above, observing a least significant bit of the respective control signals and determine the first frequency synthesizer and the second frequency synthesizer to be in-phase when the least significant bits are equal and determine the first frequency synthesizer and the second frequency synthesizer to be out-of-phase when there is a difference between the least significant bits. Optionally, the method also comprises providing 905 a correction signal, whereupon phase is changed 907 in the erring radio unit. This may comprise providing the correction signal to the erring frequency synthesizer and changing phase of the erring frequency synthesizer based on the correction signal by for example temporarily adapting a divide factor used for the erring frequency divider and/or temporarily adapting a control signal of the erring frequency divider.

The embodiments demonstrated above show a state machine mechanism based on a few standard operation elements interacting in a cunning way to implement the control circuit. This provides for reliable and low-power operation also at very high frequencies. The control circuit may also be implemented in other ways, e.g. a mixed hardware-software solution providing the sequence of controls to the second frequency divider and the multiplexer. Such a solution may for example use look-up tables for providing the sequence for different divide ratios. The detection of phase state for such a solution may include observing values indicating certain states in the control mechanism.

Figure 10:
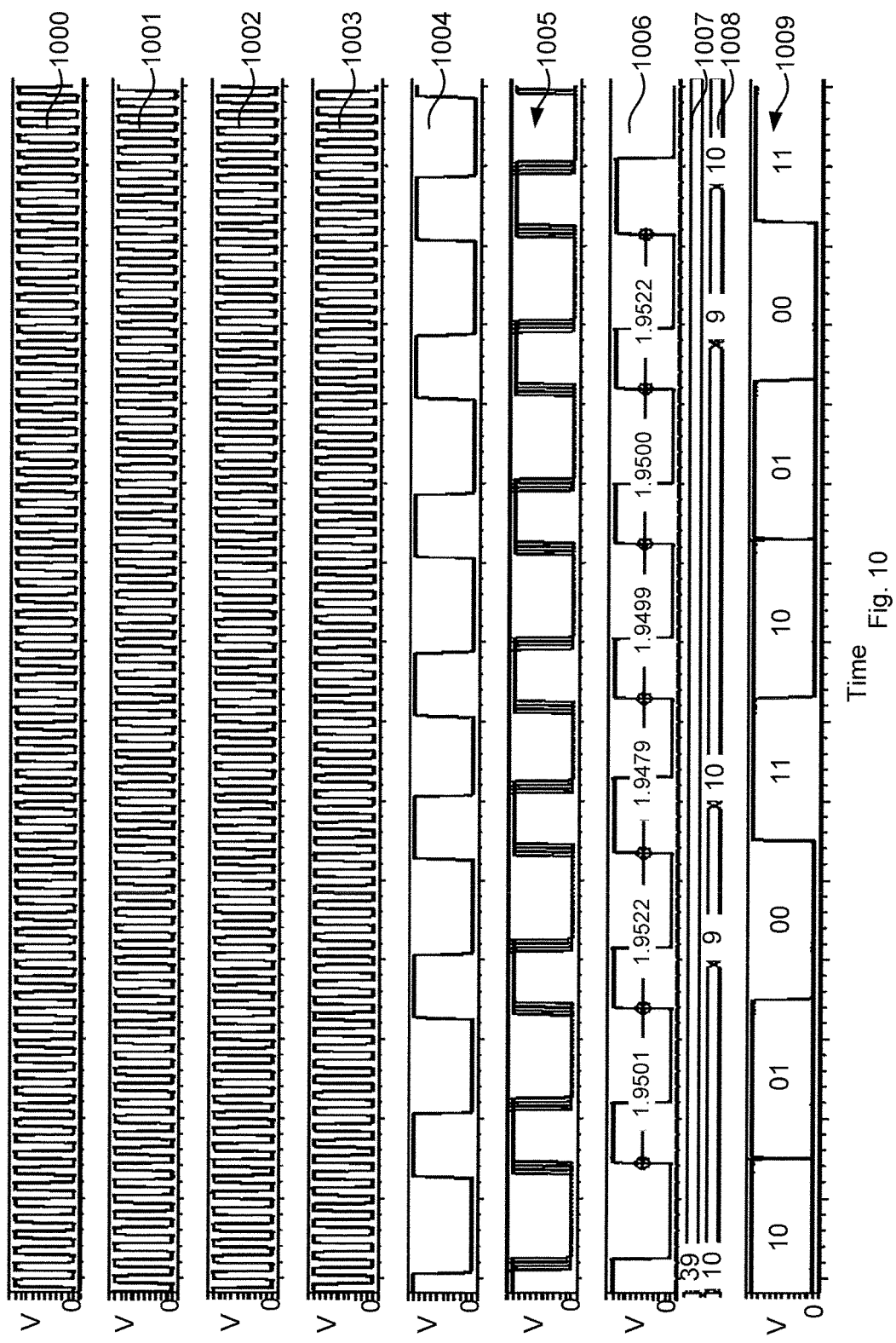
FIGS. 10 to 17 are a signal diagrams.
Figure 11:
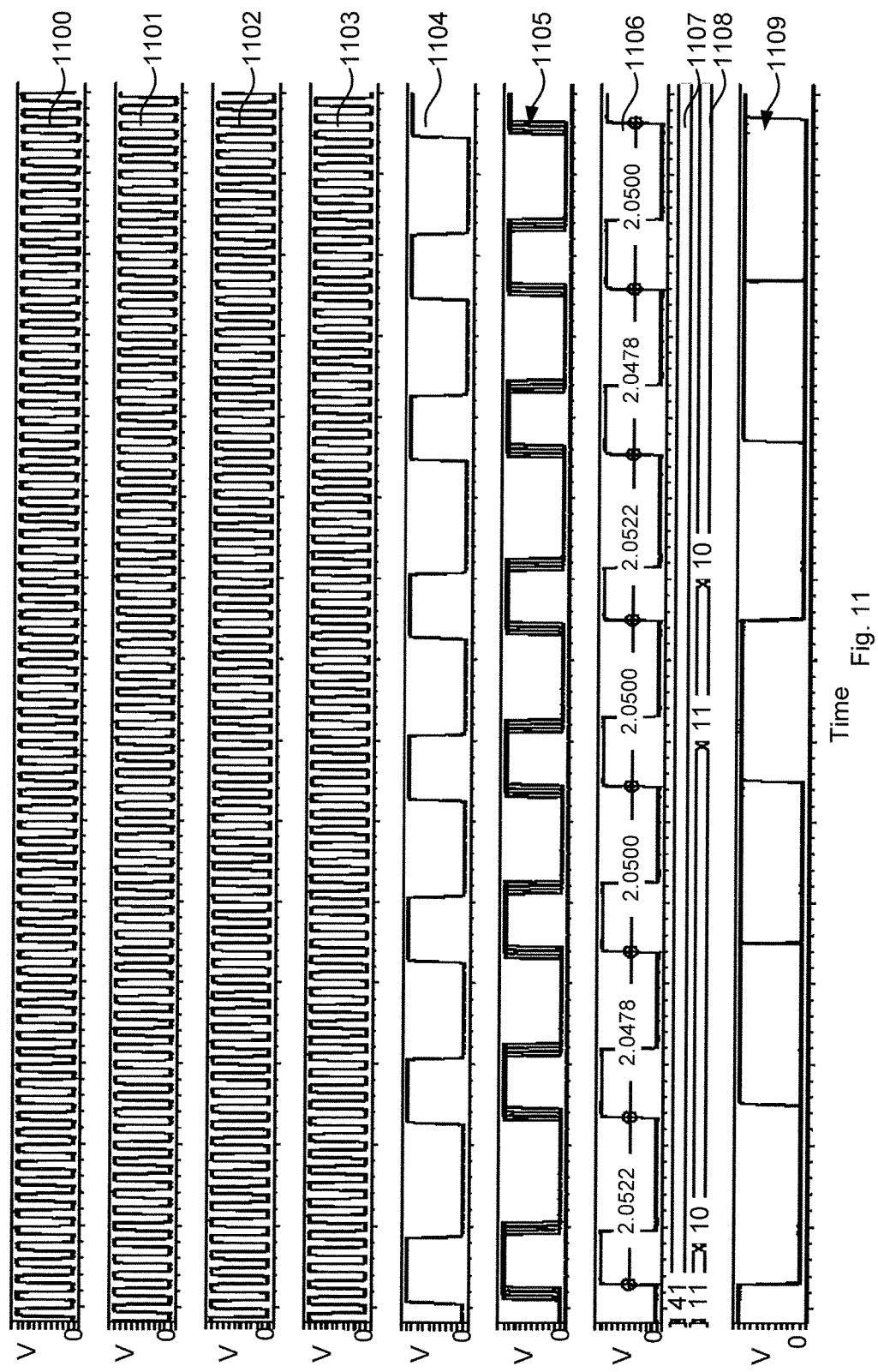

FIGS. 10 and 11 are diagrams illustrating examples for divide ratios 39 and 41, respectively, where the mechanism may be employed. These divide ratios are selected examples to be illustrated since they are examples on divide ratios which are normally hard to achieve.

FIG. 10 is a signal diagram illustrating some of the signals discussed above. Signals 1000-1003 illustrate the N formed signals, here 4, with different phases provided by the first frequency divider 406, 506. Signal 1004 illustrates the output from the second frequency divider 408, 508. Signals 1005 illustrate the versions of signals provided by the respective latch circuit 410, 510, i.e. available at inputs of the multiplexer 412, 512 and thus for selection. Signal 1006 illustrates the selected output signal of the frequency divider circuit 404, 504. Signal 1007 illustrates a control signal provided to the frequency divider circuit giving the divide ratio to be applied. In the example illustrated by FIG. 10 it is 39. Signal 1008 illustrates the first control signal provided to the second frequency divider 408, 508, which here is indicated to toggle between 9 and 10, and the consequence can be seen in the variation of cycle of signals 1004 and 1005. Signals 1009 illustrate the second control signal provided to the multiplexer 412, 512 for the selection of output signal 1006.

FIG. 11 is a signal diagram similar to FIG. 10 illustrating some of the signals discussed above, but for another divide ratio, i.e. 41. Signals 1100-1103 illustrate the N formed signals, here 4, with different phases provided by the first frequency divider 406, 506. Signal 1104 illustrates the output from the second frequency divider 408, 508. Signals 1105 illustrate the versions of signals provided by the respective latch circuit 410, 510, i.e. available at inputs of the multiplexer 412, 512 and thus for selection. Signal 1106 illustrates the selected output signal of the frequency divider circuit 404, 504. Signal 1107 illustrates a control signal provided to the frequency divider circuit giving the divide ratio to be applied. In the example illustrated by FIG. 11 it is 41. Signal 1108 illustrates the first control signal provided to the second frequency divider 408, 508, which here is indicated to toggle between 10 and 11, and the consequence can be seen in the variation of cycle of signals 1104 and 1105. Signals 1109 illustrate the second control signal provided to the multiplexer 412, 512 for the selection of output signal 1106.

Figure 12:
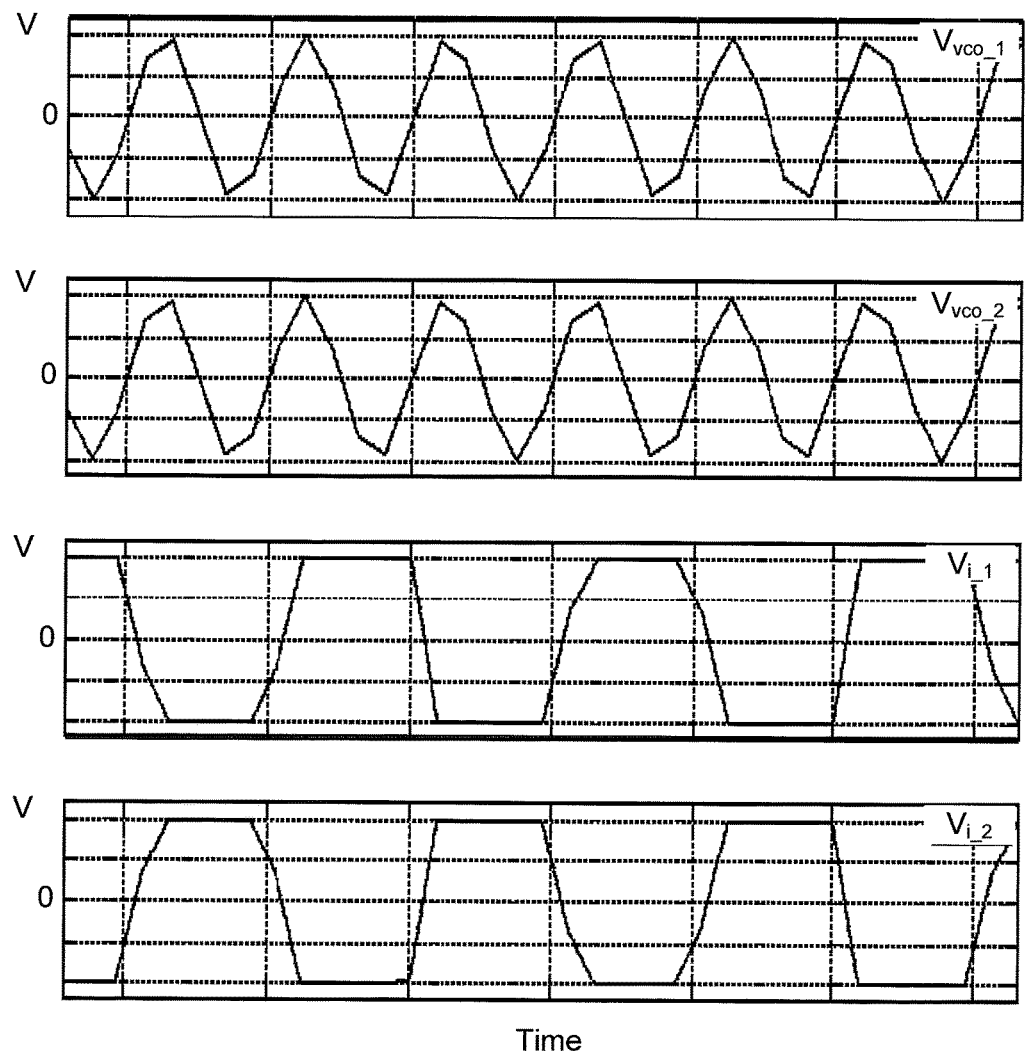
Figure 13:
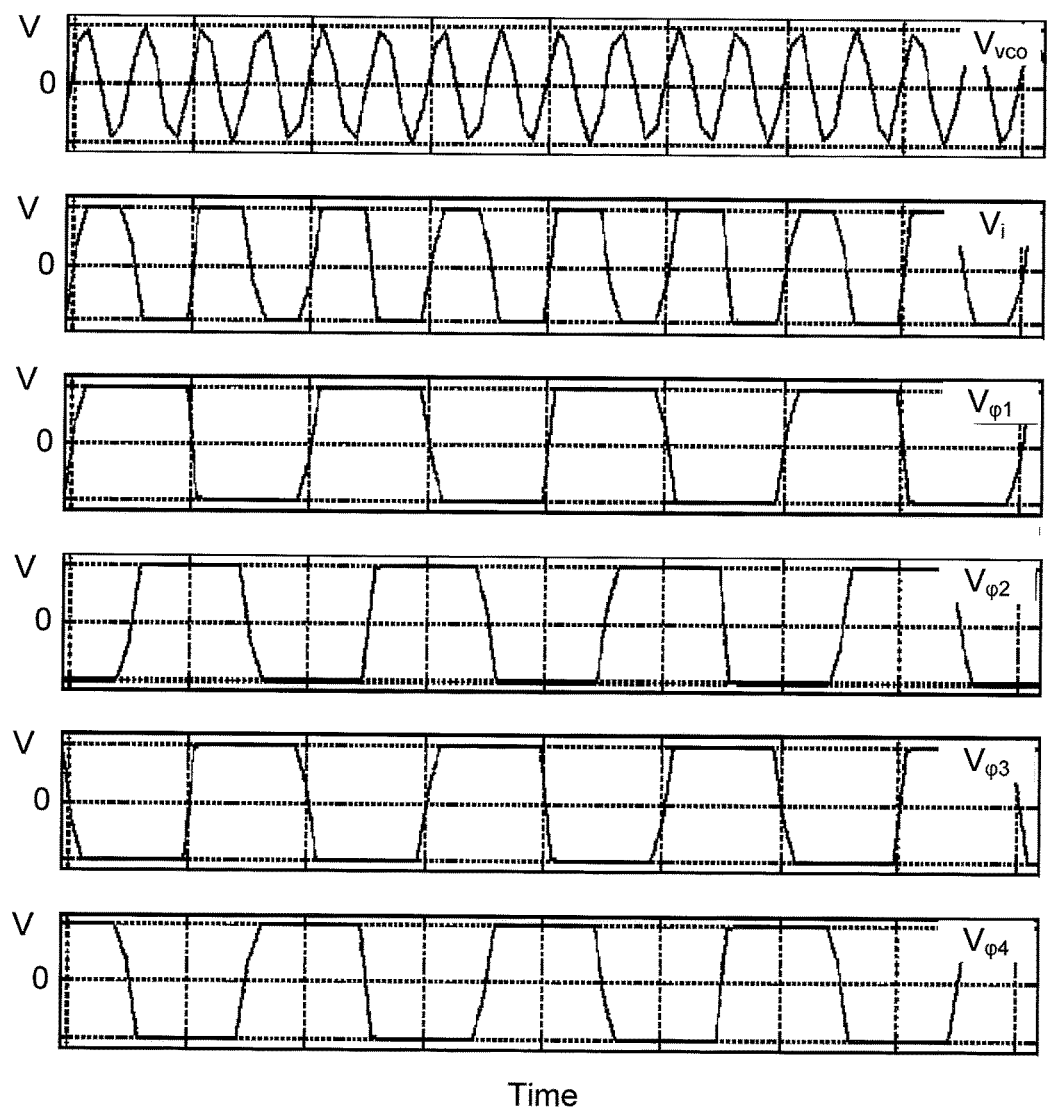
Figure 14:
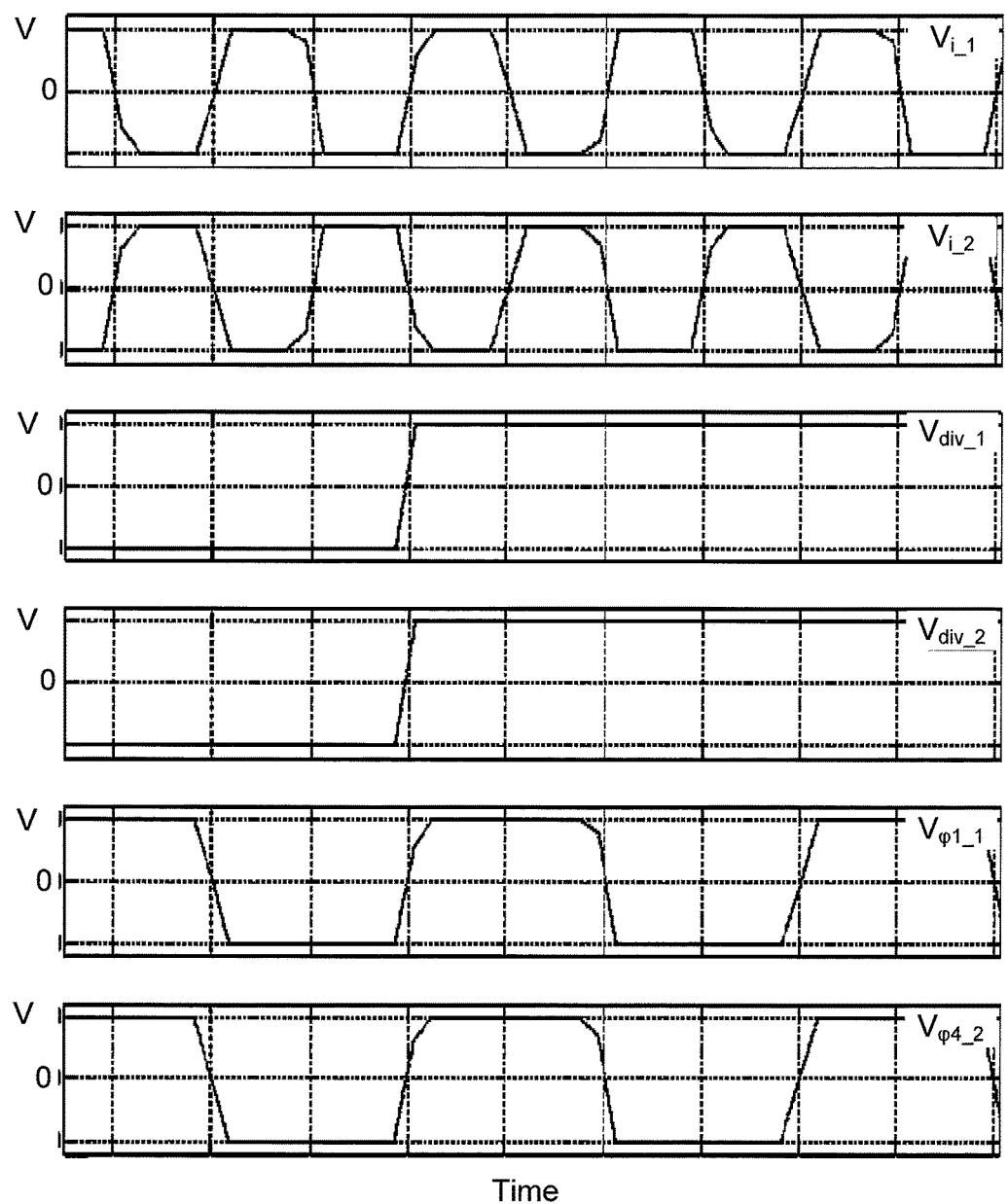

FIG. 12 is a signal diagram showing a case where two identical synthesizers of a first and a second radio unit have locked to a common reference. The divide ratio used is equal to both synthesizers at every time instant. Obviously the outputs $V_{VCO\_1}$ and $V_{VCO\_2}$ for the respective synthesizers but the quadrature dividers are out of phase, as indicated by respective in-phase signals $V_{i\_1}$ and $V_{i\_2}$ of the quadrature signals, which in this case is not desired. This is a problem that is relieved by the approach discussed above. FIG. 13 is a signal diagram showing transient signals of one synthesizer. This diagram is based on the example demonstrated above where the frequency division by the first frequency divider is performed in two steps where a first divide-by-two divider provides the quadrature signals and one of them, here the in-phase signal $V_i$ is divided by a second divide-by-two divider which provides four signals $V\varphi_1$, $V\varphi_2$, $V\varphi_3$, $V\varphi_4$ with phase values $\varphi_1$, $\varphi_2$, $\varphi_3$, $\varphi_4$. Uppermost is the synthesizer output $V_{VCO}$ followed by the quadrature divider output $V_i$ and the divide by four output signals $V\varphi_1$, $V\varphi_2$, $V\varphi_3$, $V\varphi_4$. With the situation in FIG. 12, for in-phase feed-back divider outputs, different phases are selected in the two synthesizers at every time instant. This is shown in FIG. 14 where for one time instant the phase $\varphi_1$ is triggering the divider output $V_{div\_1}$ for the first synthesizer, as seen from signal $V\varphi_{1\_1}$, and phase $\varphi_4$ is triggering the divider output $V_{div\_2}$ for the second synthesizer, as seen from signal $V_{\varphi4\_2}$.

Figure 15:
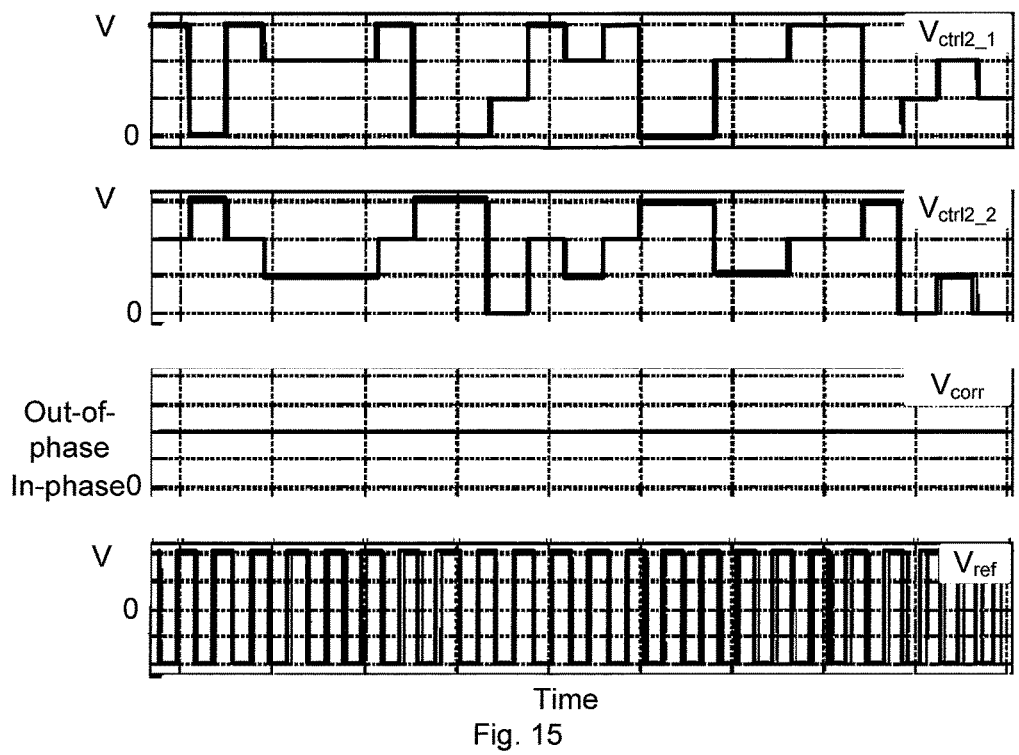

Observing FIGS. 12 to 14 again, it is clear that to make the $V_{i\_1}$ and $V_{i\_2}$ in phase for the two radio units, a shift of triggering phase from phase $\varphi_4$, either forward to phase $\varphi_1$ or backward to phase $\varphi_3$ are possible solutions. This implies that the condition for in-phase quadrature signals is an instant difference in the multiplexer-selected phase number of either 0 or 2. Using the example divider of FIG. 5, monitoring the control signals of the two synthesizers is enough to detect the phase relationship. This is shown in FIG. 15 where a same Delta Sigma Modulator (DSM) sequence causing a random-like variation of the multiplexer control signals $V_{ctrl2\_1}$ $V_{ctrl2\_2}$ for the two synthesizers of the radio units, but as the quadrature signals are out of phase, the control signal to the multiplexer is constantly differing by an un-even number. This results, considering a determination as demonstrated with reference to FIG. 6, in that the determined difference signal, monitoring the absolute value of the phase control signal difference, stays at a value of 1, as indicated for $V_{corr}$. The reference signal $V_{ref}$ is indicated for time reference purposes. That is, the divide ratio depends on the DSM sequence, and sequences, e.g. those sequences 1008, 1108 demonstrated with reference to FIGS. 10 and 11, are then results of the actual states of a divider control state machine as demonstrated above.

Figure 16:
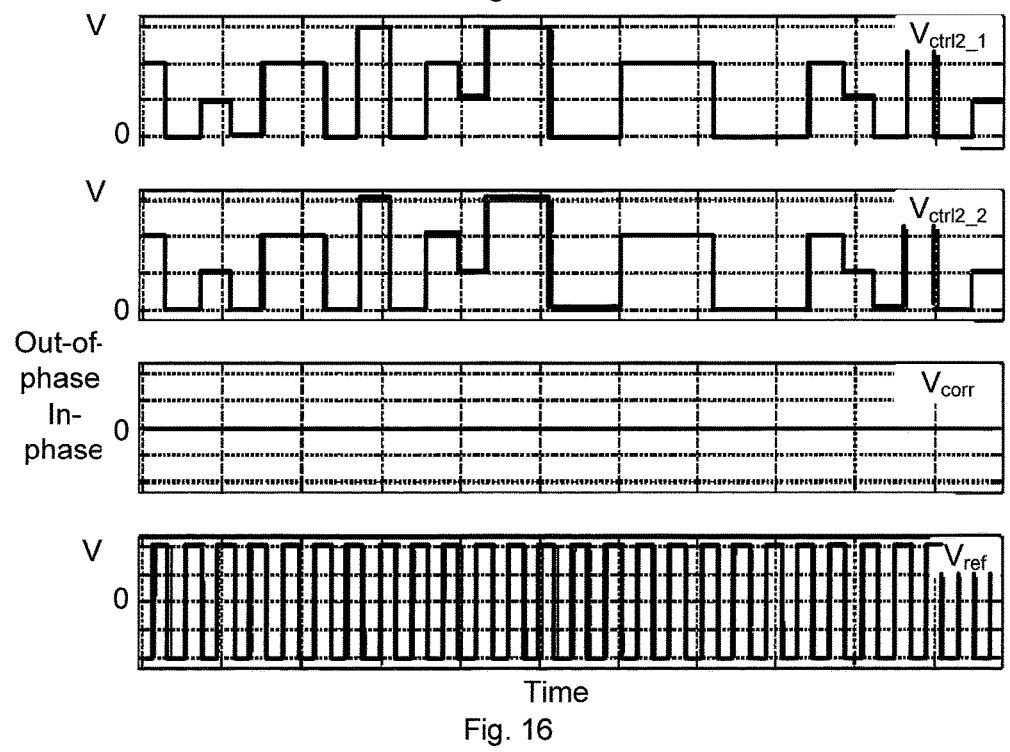
Figure 17:
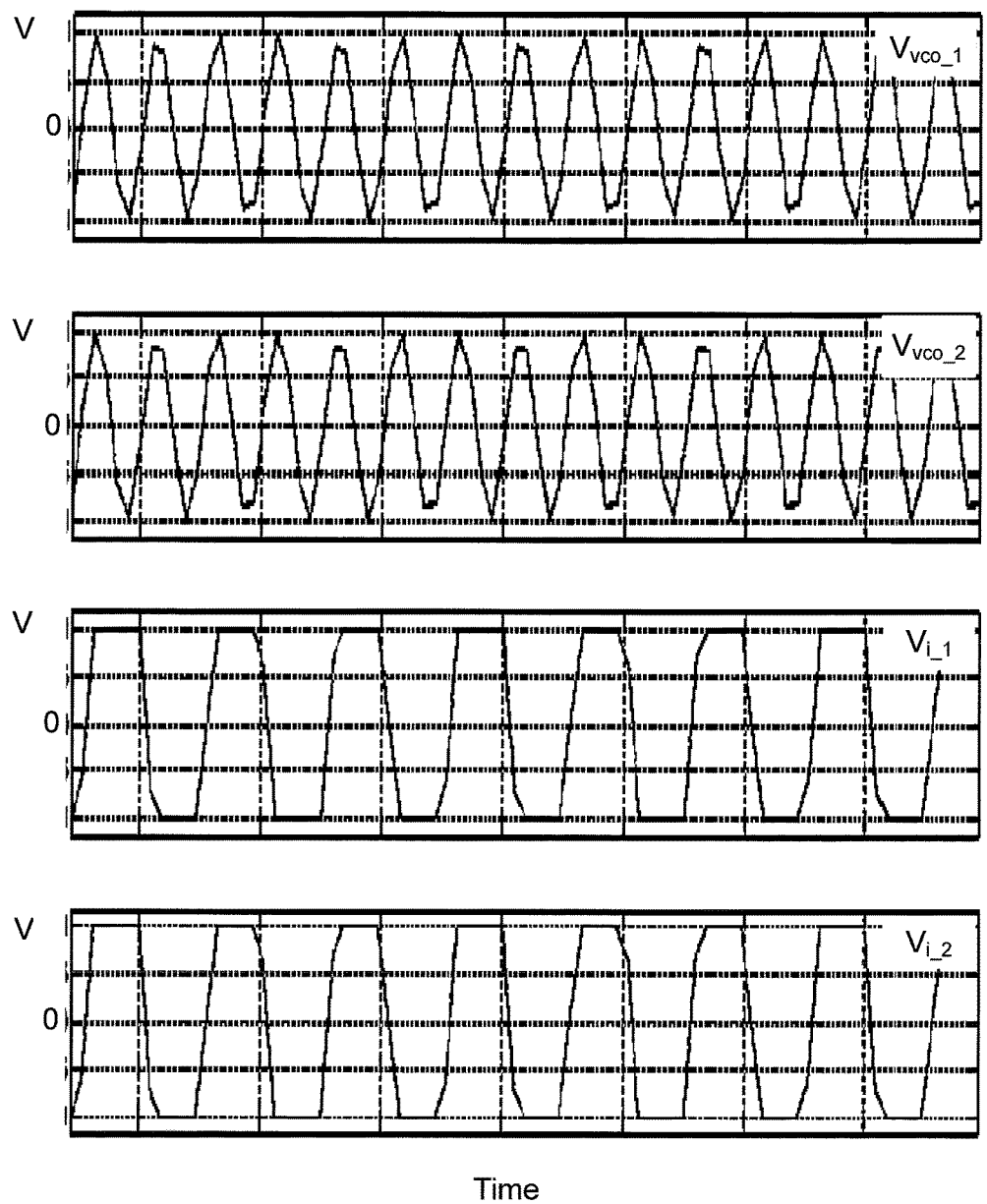

FIG. 16 is a signal diagram that corresponds to the diagram of FIG. 15, but for the case where the synthesizers of the two radio units are in-phase with each other. Similarly, FIG. 17 is a signal diagram that corresponds to the diagram of FIG. 12, but for the case where the synthesizers of the two radio units are in-phase with each other.

The approach demonstrated with its different embodiments and alternatives above is suitable for a multi-antenna radio circuit capable of for example beamforming. Such an arrangement may comprise a multitude of radio units of the kind discussed above, and thus a multitude of frequency synthesizers. The inner state value of a first frequency synthesizer of the multitude of frequency synthesizers may be compared with each of the other frequency synthesizers of the multitude of frequency synthesizers for the determining whether the quadrature signals of them are in-phase or out-of-phase, respectively, with relation to the quadrature signals of the first frequency synthesizer, according to any of the approaches demonstrated above. Thus, one of the frequency synthesizers may be considered as a master frequency synthesizer in that sense. The master frequency synthesizer may be a fixed one, but that is not necessary; the master frequency synthesizer may be determined dynamically. The dynamic determination may for example be made at setting of a certain beamforming mode where for example the number of involved antennas and radio units for the beamforming is determined.

Figure 18:
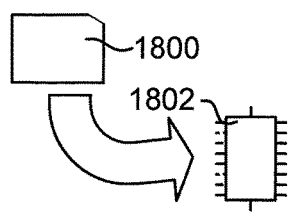
FIG. 18 schematically illustrates a computer-readable medium and a processor arranged to execute program code stored on the computer-readable medium.

The methods according to the present invention may for some embodiments be suitable for implementation with aid of processing means, such as computers and/or processors, especially for the case where the sequence for the first control signal and the second control signal is provided by a hardware-software solution as discussed above. Therefore, there is provided computer programs, comprising instructions arranged to cause the processing means, processor, or computer to perform the steps of any of the methods and approaches according to any of the embodiments described above. The computer programs preferably comprises program code which is stored on a computer readable medium 1800, as illustrated in FIG. 18, which can be loaded and executed by a processing means, processor, or computer 1802 to cause it to perform the methods, respectively, according to embodiments of the present invention, preferably as any of the embodiments described above. The computer 1802 and computer program product 1800 can be arranged to execute the program code sequentially where actions of the any of the methods are performed stepwise. The processing means, processor, or computer 1802 is preferably what normally is referred to as an embedded system. Thus, the depicted computer readable medium 1800 and computer 1802 in FIG. 18 should be construed to be for illustrative purposes only to provide understanding of the principle, and not to be construed as any direct illustration of the elements.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A quadrature phase detector circuit for a multi-antenna radio circuit, the multi-antenna radio circuit comprising a plurality of frequency synthesizers using a common reference oscillator signal, the quadrature phase detector comprising:
- a first circuit configured to collect:
  - a first state value indicating an inner state of a first quadrature signals generating frequency divider circuit of a first frequency synthesizer of the plurality of frequency synthesizers; and
  - a second state value indicating an inner state of a second quadrature signals generating frequency divider circuit of a second frequency synthesizer of the plurality of frequency synthesizers;
- a second circuit configured to determine, from the first state value and the second state value, whether quadrature signals of the first frequency synthesizer and quadrature signals of the second frequency synthesizer are in-phase or out-of-phase; and
- a third circuit configured to provide an output signal indicating whether the quadrature signals of the first frequency synthesizer and the quadrature signals of the second frequency synthesizer are in-phase or out-of-phase.

2. The quadrature phase detector circuit of claim 1, wherein the first circuit comprises connections to control signals of the first frequency divider circuit and control signals of the second frequency divider circuit.

3. The quadrature phase detector circuit of claim 2, wherein the second circuit is configured to:
- observe a least significant bit of the respective control signals; and
- determine the first frequency synthesizer and the second frequency synthesizer to be in-phase when the least significant bits are equal; and
- determine the quadrature signals of the first frequency synthesizer and the quadrature signals of the second frequency synthesizer to be out-of-phase when there is a difference between the least significant bits.

4. The quadrature phase detector circuit of claim 3, wherein:
- the second circuit comprises an exclusive-or circuit receiving the least significant bits of the respective control signals, and
- the third circuit comprises the output of the exclusive-or circuit.

5. A quadrature phase corrector for a multi-antenna radio circuit, the multi-antenna radio circuit comprising a plurality of frequency synthesizers using a common oscillator signal, the quadrature phase corrector comprising:
- a quadrature phase detector;
- a correction signal circuit configured to, based on an output of the quadrature phase detector, provide a correction signal to the second frequency synthesizer causing the second frequency synthesizer to change phase;
- wherein the quadrature phase detector comprises:
  - a first circuit configured to collect:
    - a first state value indicating an inner state of a first quadrature signals generating frequency divider circuit of a first frequency synthesizer of the plurality of frequency synthesizers; and
    - a second state value indicating an inner state of a second quadrature signals generating frequency divider circuit of a second frequency synthesizer of the plurality of frequency synthesizers;
  - a second circuit configured to determine, from the first state value and the second state value, whether quadrature signals of the first frequency synthesizer and quadrature signals of the second frequency synthesizer are in-phase or out-of-phase; and
  - a third circuit configured to provide an output signal indicating whether the quadrature signals of the first frequency synthesizer and the quadrature signals of the second frequency synthesizer are in-phase or out-of-phase.

6. The quadrature phase corrector of claim 5, wherein the correction signal is configured to temporarily adapt a divide factor used for the second frequency divider; and/or a control signal of the second frequency divider.

7. A multi-antenna radio circuit, comprising:
- a plurality of frequency synthesizers for respective antenna, wherein at least two of the plurality of frequency synthesizers are using a common reference oscillator signal and each comprises a feedback frequency divider circuit configured to:
  - receive an oscillating signal; and
  - output an output signal at a frequency having a frequency relation with the oscillating signal defined by a divide ratio;
- wherein the frequency divider circuit comprises:
  - a first frequency divider configured to receive the oscillating signal and output N signals of different phases and each with a frequency of 1/M of the oscillating signal;
  - a second frequency divider configured to receive one of the N signals and frequency divide the received signal by a value given by a first control signal provided to the second frequency divider;
  - N latch circuits, each being configured to receive a respective one of the N signals at a clocking input of the respective latch circuit and to receive an output of the second frequency divider at an input of the respective latch circuit;
  - a multiplexer circuit configured to receive outputs of the N latch circuits and to output a signal, on which the output signal is based, selected from the received signals based on a second control signal provided to the multiplexer circuit; and
  - a control circuit configured to provide the first control signal and the second control signal based on the divide ratio; and
- a quadrature phase corrector, the quadrature phase corrector comprising:
  - a quadrature phase detector;
  - a correction signal circuit configured to, based on an output of the quadrature phase detector, provide a correction signal to the second frequency synthesizer causing the second frequency synthesizer to change phase;
  - wherein the quadrature phase detector comprises:
    - a first circuit configured to collect:
      - a first state value indicating an inner state of a first quadrature signals generating frequency divider circuit of a first frequency synthesizer of the plurality of frequency synthesizers; and
      - a second state value indicating an inner state of a second quadrature signals generating frequency divider circuit of a second frequency synthesizer of the plurality of frequency synthesizers;
    - a second circuit configured to determine, from the first state value and the second state value, whether quadrature signals of the first frequency synthesizer and quadrature signals of the second frequency synthesizer are in-phase or out-of-phase; and a third circuit configured to provide an output signal indicating whether the quadrature signals of the first frequency synthesizer and the quadrature signals of the second frequency synthesizer are in-phase or out-of-phase.

8. The multi-antenna radio circuit of claim 7, wherein the state values comprise the second control signals.

9. The multi-antenna radio circuit of claim 7, wherein the inner state value of a first frequency synthesizer of the plurality of frequency synthesizers is compared with each of the other frequency synthesizers of the plurality of frequency synthesizers for determining whether the quadrature signals of them are in-phase or out-of-phase, respectively, with relation to the quadrature signals of the first frequency synthesizer.

10. The multi-antenna radio circuit of claim 9, wherein the frequency synthesizer of the plurality of frequency synthesizers to be the first frequency synthesizer is determined dynamically.

11. The multi-antenna radio circuit of claim 9, wherein the frequency synthesizer of the plurality of frequency synthesizers to be the first frequency synthesizer is fixed.

12. The multi-antenna radio circuit of claim 7, wherein the control circuit is a state machine configured to provide the first and the second control signals for each cycle of the output signal of the electronic circuit based on the divide ratio and a selected phase by the multiplexer circuit for a preceding cycle of the output signal.

13. The multi-antenna radio circuit of claim 12, wherein the control circuit comprises:
an integer divider circuit configured to divide the divide ratio by M and provide an integer quotient value and an integer remainder value;
a modulo-M-counter configured to receive the remainder value as an input and the output signal as a clocking input, and to output a count value and a carry value;
an adder circuit configured to add the quotient value and the carry value to form the first control signal,
wherein the second control signal is based on the count value.

14. The multi-antenna radio circuit of claim 13, wherein the control circuit comprises a latch circuit configured to receive the count value as an input and the output signal of the electronic circuit as a clocking signal, wherein the output from the latch circuit is the second control signal.

15. A radio station, comprising:
a multi-antenna radio circuit, the multi-antenna radio circuit comprising:
a plurality of frequency synthesizers for respective antenna, wherein at least two of the plurality of frequency synthesizers are using a common reference oscillator signal and each comprises a feedback frequency divider circuit configured to:
receive an oscillating signal; and
output an output signal at a frequency having a frequency relation with the oscillating signal defined by a divide ratio;
wherein the frequency divider circuit comprises:
a first frequency divider configured to receive the oscillating signal and output N signals of different phases and each with a frequency of 1/M of the oscillating signal;
a second frequency divider configured to receive one of the N signals and frequency divide the received signal by a value given by a first control signal provided to the second frequency divider;
N latch circuits, each being configured to receive a respective one of the N signals at a clocking input of the respective latch circuit and to receive an output of the second frequency divider at an input of the respective latch circuit;
a multiplexer circuit configured to receive outputs of the N latch circuits and to output a signal, on which the output signal is based, selected from the received signals based on a second control signal provided to the multiplexer circuit; and
a control circuit configured to provide the first control signal and the second control signal based on the divide ratio; and
a quadrature phase corrector, the quadrature phase corrector comprising:
a quadrature phase detector;
a correction signal circuit configured to, based on an output of the quadrature phase detector, provide a correction signal to the second frequency synthesizer causing the second frequency synthesizer to change phase;
wherein the quadrature phase detector comprises:
a first circuit configured to collect:
a first state value indicating an inner state of a first quadrature signals generating frequency divider circuit of a first frequency synthesizer of the plurality of frequency synthesizers; and
a second state value indicating an inner state of a second quadrature signals generating frequency divider circuit of a second frequency synthesizer of the plurality of frequency synthesizers;
a second circuit configured to determine, from the first state value and the second state value, whether quadrature signals of the first frequency synthesizer and quadrature signals of the second frequency synthesizer are in-phase or out-of-phase; and
a third circuit configured to provide an output signal indicating whether the quadrature signals of the first frequency synthesizer and the quadrature signals of the second frequency synthesizer are in-phase or out-of-phase;
an antenna arrangement comprising a plurality of antenna elements each associated with a respective one of the plurality of frequency synthesizers.

16. A method of operating a multi-antenna radio arrangement with a plurality of antenna elements each associated with a respective one of a plurality of frequency synthesizers, where at least two of the frequency synthesizers each comprise a feedback quadrature signals generating frequency divider circuit configured to receive an oscillating signal and output quadrature signals at a frequency having a frequency relation with the oscillating signal defined by a divide ratio, and the feedback quadrature signals generating frequency dividers are each controlled by a state machine configured to provide control signals for each cycle of the output signal of the feedback quadrature signals generating frequency divider based on the divide ratio and a selected phase for a preceding cycle of the output signal, the method comprising:
collecting a first state value indicating an inner state of a first quadrature signals generating frequency divider circuit of a first frequency synthesizer of the plurality of frequency synthesizers
collecting a second state value indicating an inner state of a second quadrature signals generating frequency divider circuit of a second frequency synthesizer of the plurality of frequency synthesizers;

determining, from the first state value and the second state value, whether the quadrature signals of the first frequency synthesizer and the quadrature signals of the second frequency synthesizer are in-phase or out-of-phase; and providing a phase state signal indicating whether the quadrature signals of the first frequency synthesizer and the quadrature signals of the second frequency synthesizer are in-phase or out-of-phase.

17. The method of claim 16:
wherein the quadrature signals generating frequency divider circuit comprises:
- a first frequency divider configured to receive the oscillating signal and output N signals of different phases and each with a frequency of 1/M of the oscillating signal;
- a second frequency divider configured to receive one of the N signals and frequency divide the received signal by a value given by a first control signal provided to the second frequency divider;
- N latch circuits each configured to receive a respective one of the N signals at a clocking input of the respective latch circuit and to receive an output of the second frequency divider at an input of the respective latch circuit; and
- a multiplexer circuit configured to receive outputs of the N latch circuits and to output a signal, on which the output signal is based, selected from the received signals based on a second control signal provided to the multiplexer circuit, wherein the respective state machine comprises a control circuit configured to provide the first control signal and the second control signal based on the divide ratio;

wherein the states comprises the control signals of the first frequency divider circuit and the control signals of the second frequency divider circuit;

wherein the determining comprises:
- observing a least significant bit of the respective control signals;
- determining the first frequency synthesizer and the second frequency synthesizer to be in-phase when the least significant bits are equal; and
- determining the first frequency synthesizer and the second frequency synthesizer to be out-of-phase when there is a difference between the least significant bits.

18. The method of claim 16, further comprising:
providing, based on the determining, a correction signal to the second frequency synthesizer; and
changing phase of the second frequency synthesizer based on the correction signal.

19. The method of claim 18, wherein the changing of phase comprises temporarily adapting a divide factor used for the second frequency divider and/or a control signal of the second frequency divider.

* * * * *